(12) United States Patent
O'Dell et al.

(10) Patent No.: US 7,696,303 B2
(45) Date of Patent: Apr. 13, 2010

(54) POLYMERS THEIR PREPARATION AND USES

(75) Inventors: Richard O'Dell, Taufkirchen (DE); Carl Towns, Essex (GB); Brian Tierney, Cambridgeshire (GB); Stephen O'Connor, Suffolik (GB); Ilaria Grizzi, Cambridge (GB); Clare L. Foden, Cambridge (GB); Nalinkumar Patel, Cambridgeshire (GB); Mark L. Leadbeater, Cambridge (GB); Lorraine Murtagh, Essex (GB)

(73) Assignee: Cambridge Display Technology Limited, Cambridgeshire (GB)

(*) Notice: Subject to any disclaimer, the term of this patent is extended or adjusted under 35 U.S.C. 154(b) by 0 days.

(21) Appl. No.: 10/514,137

(22) PCT Filed: May 9, 2003

(86) PCT No.: PCT/GB03/01991

§ 371 (c)(1),
(2), (4) Date: May 13, 2005

(87) PCT Pub. No.: WO03/095586

PCT Pub. Date: Nov. 20, 2003

(65) Prior Publication Data

US 2005/0209422 A1 Sep. 22, 2005

(30) Foreign Application Priority Data

| May 10, 2002 | (WO) | PCT/GB02/02167 |
| May 10, 2002 | (WO) | PCT/GB02/02179 |
| Nov. 19, 2002 | (GB) | 0226937.1 |
| Mar. 20, 2003 | (GB) | 0306410.2 |

(51) Int. Cl.
*H01L 51/54* (2006.01)
*H05B 33/14* (2006.01)
*C09K 11/06* (2006.01)
*C08G 61/12* (2006.01)

(52) U.S. Cl. ............... 528/394; 528/397; 528/422; 526/256; 526/257; 526/258; 428/690; 428/917; 313/504; 313/506; 257/40; 257/103; 252/301.16

(58) Field of Classification Search ............. 313/504, 313/506; 428/917, 690; 528/297
See application file for complete search history.

(56) References Cited

U.S. PATENT DOCUMENTS

| 4,539,507 A | 9/1985 | VanSlyke et al. | 313/504 |
| 5,723,873 A | 3/1998 | Yang | 257/40 |
| 5,798,170 A | 8/1998 | Zhang et al. | 428/212 |
| 6,309,763 B1 * | 10/2001 | Woo et al. | 428/690 |
| 6,353,083 B1 | 3/2002 | Inbasekaran | 528/295 |

FOREIGN PATENT DOCUMENTS

| EP | 259 229 B1 | 3/1988 |
| EP | 901 176 A2 | 3/1999 |
| EP | 901 176 A3 | 3/1999 |
| EP | 947 123 B1 | 10/1999 |
| EP | 1 149 827 B1 | 10/2001 |
| EP | 1 229 063 A2 | 8/2002 |
| EP | 1 229 063 A3 | 8/2002 |
| WO | WO 90/13148 | 11/1990 |
| WO | WO 98/10621 | 3/1998 |
| WO | WO 98/57381 | 12/1998 |
| WO | WO 99/48160 | 9/1999 |
| WO | WO 99/54385 | 10/1999 |
| WO | WO 00/46321 | 8/2000 |
| WO | WO 00/48258 | 8/2000 |
| WO | WO 00/53656 | 9/2000 |
| WO | WO 00/55927 | 9/2000 |
| WO | WO 01/62869 A1 | 8/2001 |
| WO | WO 02/084759 A1 | 10/2002 |
| WO | WO 02/092723 A1 | 11/2002 |
| WO | WO 02/092724 A1 | 11/2002 |

OTHER PUBLICATIONS

"The Work Function of the Elements and Its Periodicity", Michaelson, Journal of Applied Physics, vol. 48, No. 11, Nov. 1977, pp. 4729-4733.
Thermally Stable Blue-Light-Emitting Copolymers of Poly(alkylfluorene), Kreyenschmidt et al., Macromolecules 31, 1998, pp. 1099-1103.

(Continued)

*Primary Examiner*—D. Lawrence Tarazano
*Assistant Examiner*—Camie S Thompson
(74) *Attorney, Agent, or Firm*—Marshall, Gerstein & Borun LLP

(57) ABSTRACT

A polymer for use in an optical device comprising a first, optionally substituted, repeat unit of formula

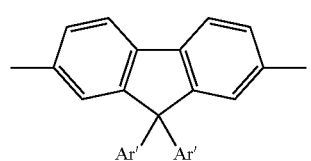

(I)

and a second, optionally substituted, repeat unit of formula

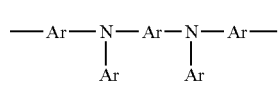

(II)

wherein each Ar and Ar' is the same or different and comprises an optionally substituted aryl or heteroaryl group and optionally a third, optionally substituted, repeat unit in a molar ratio of no greater than 5%, the third repeat unit having a formula —Ar—N(Ar)—Ar— and having a single nitrogen atom in its backbone.

21 Claims, 2 Drawing Sheets

OTHER PUBLICATIONS

"A Novel RGB Multicolor Light-Emitting Polymer Display", Kobayashi et al., Synthetic Metals 111-112, 2000, pp. 125-128.

"Efficient Polymer Light Emitting Diodes with Metal Fluoride/Al Cathodes", Yang et al., Applied Physics Letters, vol. 79, No. 5, Jul. 30, 2001, pp. 563-565.

"Thermal Annealing Below the Glass Transition Temperature: A General Way to Increase Performance of Light-Emitting Diodes Based on Copolyfluorenes", Niu et al., Applied Physics Letters, vol. 81, No. 4, Jul. 22, 2002.

International Search Report in PCT/GB03/01991 dated Jul. 24, 2003.

Search Report in GB 0306410.2 dated Aug. 15, 2003.

* cited by examiner

POLYMERS THEIR PREPARATION AND USES

This is the U.S. national phase of International Application No. PCT/GB03/01991 filed May 9, 2003, the entire disclosure of which is incorporated herein by reference.

BACKGROUND OF THE INVENTION

1. Field of the Disclosure

The disclosure relates to materials for optical devices, in particular organic electroluminescent devices, and the control of their physical and electronic properties.

2. Related Technology

One class of opto-electrical devices is those using an organic material for light emission or detection. The basic structure of these devices is a light emissive organic layer, for instance a film of a poly (p-phenylenevinylene) ("PPV") or polyfluorene, sandwiched between a cathode for injecting negative charge carriers (electrons) and an anode for injecting positive charge carriers (holes) into the organic layer. The electrons and holes combine in the organic layer generating photons. In WO 90/13148 the organic light-emissive material is a polymer. In U.S. Pat. No. 4,539,507 the organic light-emissive material is of the class known as small molecule materials, such as (8-hydroxyquinoline) aluminium ("Alq3"). In a practical device one of the electrodes is transparent, to allow the photons to escape the device.

A typical organic light-emissive device ("OLED") is fabricated on a glass or plastic substrate coated with a transparent first electrode such as indium-tin-oxide ("ITO"). A layer of a thin film of at least one electroluminescent organic material covers the first electrode. Finally, a cathode covers the layer of electroluminescent organic material. The cathode is typically a metal or alloy and may comprise a single layer, such as aluminium, or a plurality of layers such as calcium and aluminium. Other layers can be added to the device, for example to improve charge injection from the electrodes to the electroluminescent material. For example, a hole injection layer such as poly(ethylene dioxythiophene)/polystyrene sulfonate (PEDOT-PSS) or polyaniline may be provided between the anode and the electroluminescent material. When a voltage is applied between the electrodes from a power supply one of the electrodes acts as a cathode and the other as an anode.

For organic semiconductors important characteristics are the binding energies, measured with respect to the vacuum level of the electronic energy levels, particularly the "highest occupied molecular orbital" (HOMO) and the "lowest unoccupied molecular orbital" (LUMO) level. These can be estimated from measurements of photoemission and particularly measurements of the electrochemical potentials for oxidation and reduction. It is well understood in this field that such energies are affected by a number of factors, such as the local environment near an interface, and the point on the curve (peak) from which the value is determined. Accordingly, the use of such values is indicative rather than quantitative.

In operation, holes are injected into the device through the anode and electrons are injected into the device through the cathode. The holes and electrons combine in the organic electroluminescent layer to form an exciton which then undergoes radiative decay to give light. One way of improving efficiency of devices is to provide hole and electron transporting materials—for example, WO 99/48160 discloses blending of hole transporting polymers, electron transporting polymers and electroluminescent polymers. A 1:1 copolymer of dioctylfluorene and triphenylamine is used as the hole transporting polymer in this document.

A focus in the field of polymer OLEDs is the development of full colour displays for which red, green and blue emissive materials are required. One drawback with existing polymer OLED displays relevant to this development is the relatively short lifetime of blue emissive materials known to date (by "lifetime" is meant the time for the brightness of the OLED to halve at constant current when operated under DC drive).

In one approach, the lifetime of the emissive material may be extended by optimisation of the OLED architecture; for example lifetime of the blue material may in part be dependant on the cathode being used. However, the advantage of selecting a cathode that improves blue lifetime may be offset by disadvantageous effects of the cathode on performance of red and green materials. For example, Synthetic Metals 111-112 (2000), 125-128 discloses a full colour display wherein the cathode is LiF/Ca/Al. The present inventors have found that this cathode is particularly efficacious with respect to the blue emissive material but which shows poor performance with respect to green and, especially, red emitters.

Another approach is development of novel blue electroluminescent materials. For example, WO 00/55927, which is a development of WO 99/48160, discloses a blue electroluminescent polymer of formula (a):

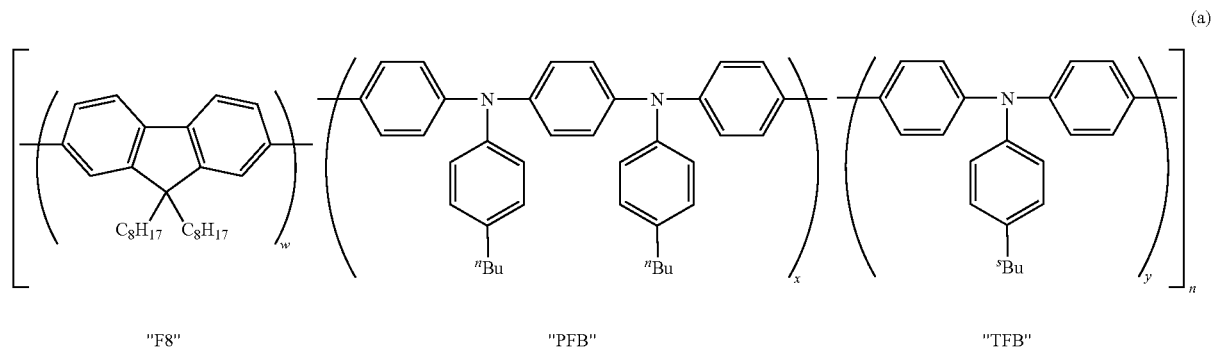

wherein w+x+y=1, w≧0.5, 0≦x+y≦0.5 and n≧2

In essence, the separate polymers disclosed in WO 99/48160 are combined into a single molecule. The F8 repeat unit is provided for the purpose of electron injection; the TFB unit is provided for the purpose of hole transport; and the PFB repeat unit is provided as the emissive unit.

WO 99/54385 and EP 1229063 disclose copolymers of fluorenes and amines.

It is an object of the present disclosure to provide a means for increasing the lifetime of polymers for use in an optical device above that of prior art polymers. It is a further object of the disclosure to provide a long-lived polymer for use in an optical device, particularly a long-lived blue electroluminescent material. It is a yet further object of the disclosure to provide a means for increasing the thermal stability of prior art polymers.

SUMMARY OF THE DISCLOSURE

The lifetime of a polymer for use in an optical device, in particular an electroluminescent polymer, may be increased by the incorporation of repeat units that increase the glass temperature (Tg) of the polymer. In one embodiment, incorporation of 2,7-linked 9,9-diarylfluorene repeat units into an electroluminescent polymer, particularly a blue emissive electroluminescent polymer, results in significant increase in that polymer's lifetime. Furthermore, it is unnecessary to have separate hole transporting units and blue emissive units; it has been found that both functions may be performed by the PFB unit. Surprisingly, the omission of TFB from the prior art polymers described above is found to result in a significant improvement in lifetime.

BRIEF DESCRIPTION OF THE DRAWINGS

The disclosure will now be described in further detail, by way of example only, with reference to the accompanying drawings in which.

DETAILED DESCRIPTION

Figure 1:
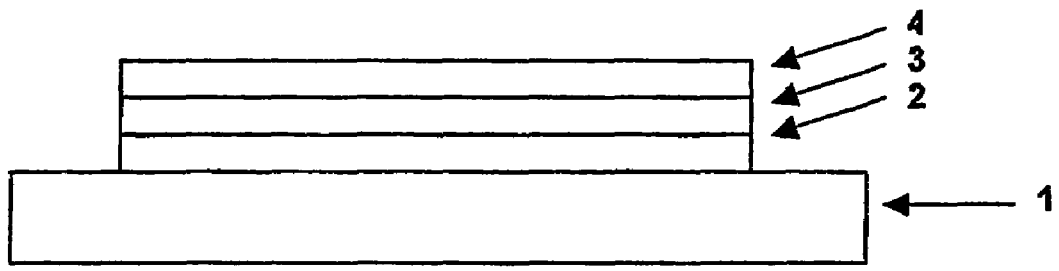
FIG. 1 shows a prior art electroluminescent device

Accordingly, in a first aspect the disclosure provides a polymer for use in an optical device comprising a first, optionally substituted, repeat unit of formula (I) and a second, optionally substituted, repeat unit of formula (II):

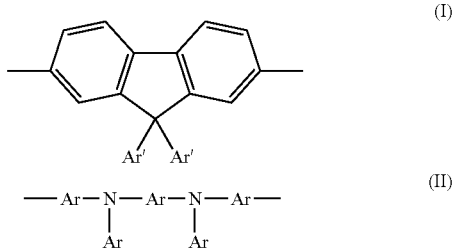

wherein each Ar and Ar' is the same or different and comprises an optionally substituted aryl or heteroaryl group and, optionally, a third, optionally substituted, repeat unit in a molar ratio of no greater than 5%, the third repeat unit having a formula —Ar—N(Ar)—Ar— and having a single nitrogen atom in its backbone.

Preferably, each Ar is phenyl. More preferably, the second repeat unit comprises a repeat unit of formula (III):

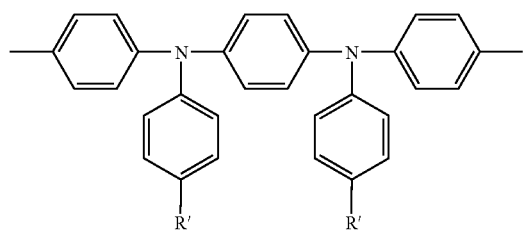

wherein each R' is independently selected from hydrogen or a solubilising group.

Preferably, the third repeat unit is absent. Preferably, the polymer comprises no repeat units comprising nitrogen atoms in the repeat unit backbone other than the repeat unit of formula (II).

Accordingly, in a first aspect the disclosure provides a polymer for use in an optical device comprising an optionally substituted repeat unit of formula (I) and an optionally substituted repeat unit of formula (II):

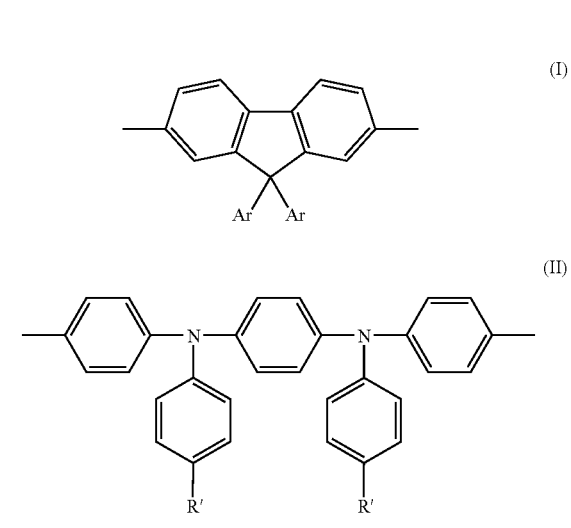

wherein each Ar and Ar' is the same or different and comprises an optionally substituted aryl or heteroaryl group and optionally a third, optionally substituted, repeat unit in a molar ratio of no greater than 5%, the third repeat unit having formula Ar—N(Ar)—Ar— and having a single nitrogen atom in its backbone.

Preferably, each Ar is independently selected from the group comprising an optionally substituted residue of formula (IV):

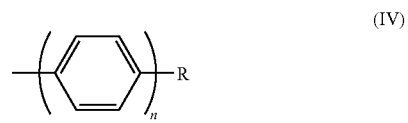

wherein n=1, 2 or 3 and R is a solubilizing group or hydrogen. Preferred solubilizing groups R are selected from optionally substituted alkyl or alkoxy, preferably butyl.

Preferably, each R' is optionally substituted alkyl or alkoxy, more preferably butyl, most preferably n-butyl.

Preferably, the polymer according to the first aspect of the disclosure comprises less than 50 mol %, more preferably 10-40 mol %, of repeat units of formula (I).

Reducing the amine content within a polymer results in an increase in the efficiency of that material in certain device architectures, in particular devices with cathodes having a relatively high work function resulting in relatively poor electron injecting ability such as barium (wf=2.7 eV), strontium (wf=2.59 eV) or calcium (wf=2.87 eV) (source: J. Appl. Phys. 48(11) 1977, 4729.) Accordingly, in one preferred embodiment the polymer according to the first aspect of the disclosure comprises less than 30 mol %, more preferably less than 10 mol %, of repeat units of formula (II).

Preferably, the polymer according to the first aspect of the disclosure comprises a further repeat unit selected from optionally substituted 9,9-dialkyl- or 9,9-dialkoxy-2,7-fluorenyl, more preferably 9,9-di(n-octyl)fluorene.

Preferably, the polymer according to the first aspect of the disclosure is an electroluminescent polymer, more preferably a polymer capable of emitting light in the wavelength range 400-500 nm, most preferably 430-500 nm.

In a second aspect, the disclosure provides an electroluminescent device comprising a first electrode for injection of positive charge carriers, a second electrode for injection of negative charge carriers and an electroluminescent region located between the first and second electrode comprising a polymer according to the first aspect of the disclosure. Preferably, the polymer according to the first aspect of the disclosure is the only, semiconducting polymer in the electroluminescent region.

By "electroluminescent region" is meant that layer of an electroluminescent device comprising a polymer comprising a repeat unit of formula (II) from which electroluminescence is obtained. For the avoidance of doubt, it will be appreciated that, where present, a hole injection material (such as PEDOT-PSS or polyaniline), a hole transporting layer or an electron transporting layer separate from the electroluminescent layer do not constitute a part of the electroluminescent region.

Polymers according to the disclosure are preferably copolymers comprising an arylene co-repeat unit Ar such as a fluorene, particularly 2,7-linked 9,9 dialkyl fluorene or 2,7-linked 9,9 diaryl fluorene; a spirofluorene such as 2,7-linked 9,9-spirofluorene; an indenofluorene such as a 2,7-linked indenofluorene; or a phenyl such as alkyl or alkoxy substituted 1,4-phenylene. Each of these groups may be substituted.

Further suitable Ar groups are known in this art, for example as disclosed in WO 00/55927 and WO 00/46321, the contents of which are incorporated herein by reference.

A polymer according to the disclosure may comprise a homopolymer, copolymer, terpolymer or higher order polymer.

A copolymer, terpolymer or higher order polymer according to the disclosure includes regular alternating, random and block polymers where the percentage of each monomer used to prepare the polymer may vary.

For ease of processing, it is preferred that the polymer is soluble. Substituents such as $C_{1-10}$ alkyl or $C_{1-10}$ alkoxy may usefully be selected to confer on the polymer solubility in a particular solvent system. Typical solvents include mono- or poly-alkylated benzenes such as toluene and xylene or THF.

Two polymerisation techniques that are particularly amenable to preparation of conjugated polymers from aromatic monomers are Suzuki polymerisarion as disclosed in, for example, WO 00/53656 and Yamamoto polymerisation as disclosed in, for example, "Macromolecules", 31, 1099-1103 (1998). Suzuki polymerisation entails the coupling of halide and boron derivative functional groups; Yamamoto polymerisation entails the coupling of halide functional groups. Accordingly, it is preferred that each monomer is provided with two reactive functional groups P wherein each P is independently selected from the group consisting of (a) boron derivative functional groups selected from boronic acid groups, boronic ester groups and borane groups and (b) halide functional groups.

With reference to FIG. 1, the standard architecture of an optical device according to the disclosure, in particular an electroluminescent device, comprises a transparent glass or plastic substrate 1, an anode of indium tin oxide 2 and a cathode 4. The polymer is located in layer 3 between anode 2 and cathode 4. Layer 3 may comprise the polymer alone or a plurality of polymers. Where a plurality of polymers are deposited, they may comprise a blend of at least two of a hole transporting polymer, an electron transporting polymer and, where the device is a PLED, an emissive polymer as disclosed in WO 99/48160. Alternatively, layer 3 may be formed from a single polymer that comprises regions selected from two or more of hole transporting regions, electron transporting regions and emissive regions as disclosed in, for example, WO 00/55927 and U.S. Pat. No. 6,353,083. Each of the functions of hole transport, electron transport and emission may be provided by separate polymers or separate regions of a single polymer. Alternatively, more than one function may be performed by a single region or polymer. In particular, a single polymer or region may be capable of both charge transport and emission. Each region may comprise a single repeat unit, e.g. a triarylamine repeat unit may be a hole transporting region. Alternatively, each region may be a chain of repeat units, such as a chain of polyfluorene units as an electron transporting region. The different regions within such a polymer may be provided along the polymer backbone, as per U.S. Pat. No. 6,353,083, or as groups pendant from the polymer backbone as per WO 01/62869.

In addition to layer 3, a separate hole transporting layer and/or an electron transporting layer may be provided.

Although not essential, a layer of organic hole injection material (not shown) between the anode 2 and the polymer layer 3 is desirable because it assists hole injection from the anode into the layer or layers of semiconducting polymer. Examples of organic hole injection materials include poly (ethylene dioxythiophene) (PEDT/PSS) as disclosed in EP 0901176 and EP 0947123, or polyaniline as disclosed in U.S. Pat. No. 5,723,873 and U.S. Pat. No. 5,798,170.

Cathode 4 is selected from materials that have a workfunction allowing injection of electrons into the electroluminescent layer. Other factors influence the selection of the cathode such as the possibility of adverse interactions between the cathode and the electroluminescent material. The cathode may consist of a single material such as a layer of aluminium. Alternatively, it may comprise a plurality of metals, for example a bilayer of calcium and aluminium as disclosed in WO 98/10621, elemental barium disclosed in WO 98/57381, Appl. Phys. Lett. 2002, 81(4), 634 and WO 02/84759 or a thin layer of dielectric material to assist electron injection, for example lithium fluoride disclosed in WO 00/48258 or barium fluoride, disclosed in Appl. Phys. Lett. 2001, 79(5), 2001.

A typical electroluminescent device comprises an anode having a workfunction of 4.8 eV. Accordingly, the HOMO level of the hole transporting region is preferably around 4.8-5.5 eV. Similarly, the cathode of a typical device will have a workfunction of around 3 eV. Accordingly, the LUMO level of the electron transporting region is preferably around 3-3.5 eV.

Electroluminescent devices may be monochrome devices or full colour devices (i.e. formed from red, green and blue electroluminescent materials).

EXAMPLES

Monomer Examples

Monomers were prepared in accordance with the scheme below:

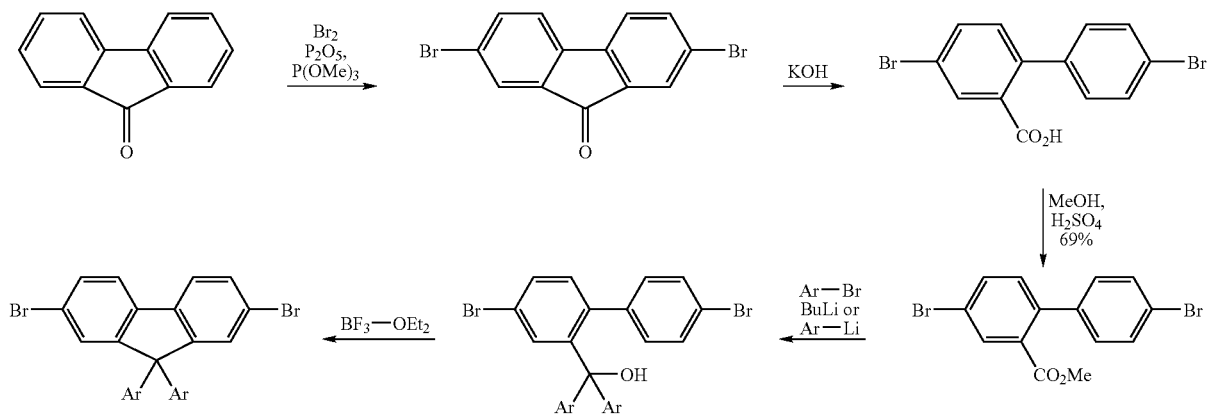

Monomer Example M1

2,7-dibromo-9,9-diphenylfluorene

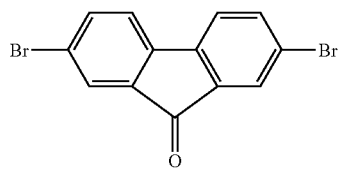

2,7-Dibromofluorenone

In a 3 L flange flask fluorenone (100.006 g, 0.555 mol), phosphorus pentoxide (110.148 g, 0.776 mol) and trimethylphosphate (1200 mL) were mixed. Under mechanical stirring, a solution of bromine (63 mL, 1.23 mol) in trimethylphosphate (200 mL) was quickly added. This clear solution was then heated for 22 hours at 120° C. The mixture was allowed to cool to room temperature, then poured into 3 L of water. When sodium thiosulfate was added (50.045 g) the mixture turned yellow. Stirring was maintained for 1 hour then the yellow solid was filtered. This solid was heated in methanol to remove the mono-brominated compound and gave 176.183 g (98% pure by HPLC, 94% yield).

$^1$H NMR (CDCl$_3$) 7.73 (2H, d, J 2.0), 7.61 (2H, dd, J 7.6, 2.0), 7.36 (2H, d, J 8.0); $^{13}$C NMR (CDCl$_3$) 142.3, 137.5, 135.3, 127.9, 123.3, 121.8, 109.8.

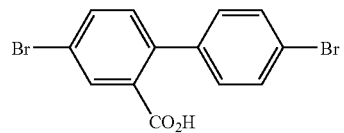

4,4′-Dibromo-2-carboxylic acid-1,1′-biphenyl

In a 2 L flange flask 2,7-dibromofluorenone (120.526 g, 0.356 mol), potassium hydroxide (finely powdered flakes, 168.327 g, 3.000 mol) and toluene (600 mL) were placed. This mixture was heated at 120° C. for four hours then left to cool to room temperature. Water was added to dissolve the solid (~2 L) under vigorous stirring. The greenish aqueous layer was removed and the yellow toluene layer was washed twice with water. The combined aqueous layers were acidified with concentrated hydrochloric acid then the precipitated solid was filtered, dried then recrystallised from toluene to give 100.547 g of off white crystals (79% yield); $^1$H NMR ((CD$_3$)$_2$CO) 8.00 (1H, d, J 2.0), 7.77 (1H, dd, J 8.0, 2.4), 7.57 (2H, d, J 8.0), 7.34 (1H, d, J 8.4), 7.29 (2H, d, J 8.8); $^{13}$C NMR ((CD$_3$)$_2$CO) 167.1, 140.4, 139.8, 134.2, 133.5, 132.8, 132.7, 131.2, 130.6, 121.4, 121.1.

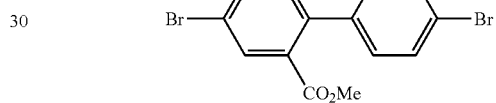

Methyl ester of 4,4′-dibromo-2-carboxylic acid-1,1′-biphenyl 4,4-dibromo-2-carboxylic acid biphenyl (171.14 g, 0.481 mol) was suspended in methanol (700 mL) and sulfuric acid (15 mL) then heated at 80° C. for 21 hours. The solvent was removed and the oil was dissolved in ethyl acetate. This solution was washed with 2N sodium hydroxide, water, saturated sodium chloride, dried over magnesium sulfate, filtered and evaporated to give an orange oil. This oil was treated with hot methanol, on cooling the ester precipitated out and was filtered. The mother liquor was evaporated and the solid recrystallised giving additional product. The ester was 100% pure by GCMS, a yield of 123.27 g (69%) was obtained; $^1$H NMR (CDCl$_3$) 7.99 (1H, d, J 2.0), 7.64 (1H, dd, J 8.0, 1.6), 7.51 (2H, d, J 8.4), 7.19 (1H, d, J 8.8), 7.13 (2H, d, J 8.8), 3.67 (3H, s); $^{13}$C NMR (CDCl$_3$) 167.1, 140.3, 139.1, 134.4, 132.9, 132.1, 132.0, 131.3, 129.8, 121.9, 121.5, 52.3; GCMS: M$^+$=370

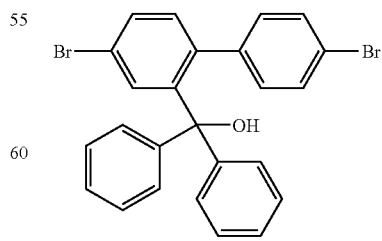

4,4′-dibromo-2-diphenyl alcohol-1,1′-biphenyl 4,4-dibromo-2-methyl ester-biphenyl (24.114 g, 65.1 mmol) was dissolved in dry diethyl ether (120 mL) and the solution was cooled to −60° C. by using an isopropanol/dry ice bath. Phenyl lithium (1.8M solution in cyclohexane-ether, 91 mL) was then added dropwise. The mixture was stirred and let to warm to room temperature. The reaction was complete after four hours. Water was added (70 mL) then the aqueous layer washed once with diethyl ether. Combined organic phases were washed with sodium chloride, dried over magnesium sulfate, filtered and evaporated to give a yellow powder. Recrystallisation from isopropanol afforded 19 g of white solid (59% yield); GC-MS (m/z, relative intensity %) 494 (M+, 100); $^1$H NMR (CDCl$_3$) 7.43 (1H, dd, J 8.4, 2.4), 7.28 (6H, m), 7.23 (2H, d, J 8.0), 7.11 (4H, m), 6.99 (1H, d, J 2.4), 6.94 (1H, d, J 8.4), 6.61 (2H, d, J 8.4); $^{13}$C NMR (CDCl$_3$) 147.5, 146.7, 140.3, 139.3, 134.0, 133.0, 131.2, 131.1, 130.3, 128.2, 128.1, 127.8, 121.8, 121.3, 83.2.

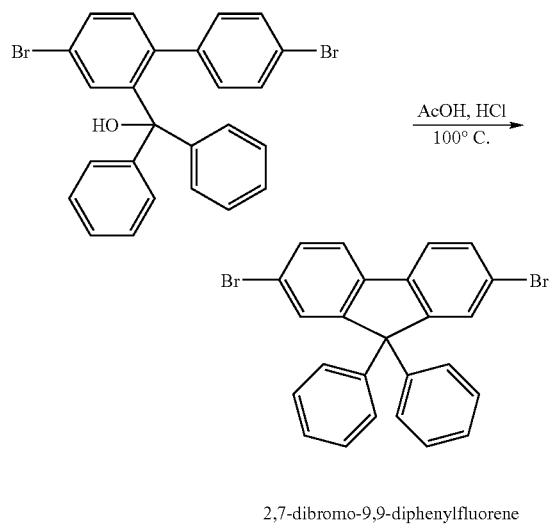

2,7-dibromo-9,9-diphenylfluorene

The alcohol (69.169 g, 140 mmol) and glacial acetic acid (450 ml) were stirred and heated to reflux, then concentrated hydrochloric acid (0.5 ml) was added dropwise. When the addition was completed the mixture was heated for one hour and then cooled. The reaction mixture was poured into water (500 ml), after which the solid was filtered off. The white solid was recrystallised from n-butyl acetate three times to give 20.03 g of desired product (99.59% by HPLC, 30% yield).

$^1$H NMR (CDCl$_3$), δ/ppm: 7.58 (2H, d, J 7.6), 7.49 (2H, d, 1.2), 7.48 (2H, dd, 1.6), 7.25 (6H, m), 7.14 (4H, m).

$^{13}$C NMR (CDCl$_3$), δ/ppm: 153.2, 144.6, 138.3, 131.1, 129.6, 128.7, 128.2, 127.4, 122.0, 121.7, 65.8.

Monomer Examples M2-M4

Monomers with Ar groups as detailed in the table below were prepared in accordance with the scheme and general experimental process outlined above. Aryllithium compounds corresponding to Ar groups shown in the table were prepared from the corresponding aryl bromide.

| Monomer example no. | Ar | Yield of monomer |
|---|---|---|
| M2 | ![phenyl-tBu] | 90% |
| M3 | ![methyl-biphenyl] | 24% |
| M4 | ![biphenyl-tBu] | 22% |

Polymer Example P1

A blue electroluminescent polymer was prepared in accordance with the process of WO 00/53656 by reaction of 9,9-di-n-octylfluorene-2,7-di(ethylenylboronate) (0.5 equivalents), 2,7-dibromo-9,9-diphenylfluorene (0.35 equivalents) and N,N'-di(4-bromophenyl)-N,N'-di(4-n-butylphenyl)-1,4-diaminobenzene (0.15 equivalents) to give polymer P1:

P1

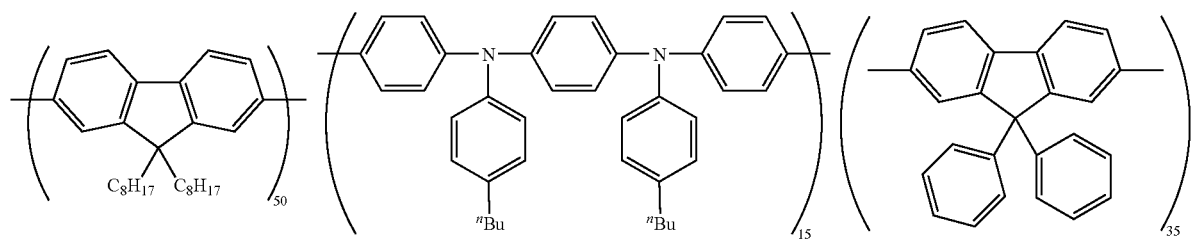

Device Example

Onto indium tin oxide supported on a glass substrate (available from Applied Films, Colorado, USA) was deposited a layer of PEDT/PSS, available from Bayer® as Baytron P® by spin coating. A layer of polymer P1 was deposited over the PEDT/PSS layer by spin-coating from xylene solution. Onto the polymer P1 was deposited a cathode consisting of a first layer of lithium fluoride, a second layer of calcium and a third, capping layer of aluminium.

For the purpose of composition with P1, an identical device was prepared except that the electroluminescent polymer comprised 10% TFB repeat units (full composition: 10%

TFB; 50% F8; 30% 2,7-linked 9,9-diarylfluorene; 10% PFB—disclosed in WO 02/92723).

Figure 2:
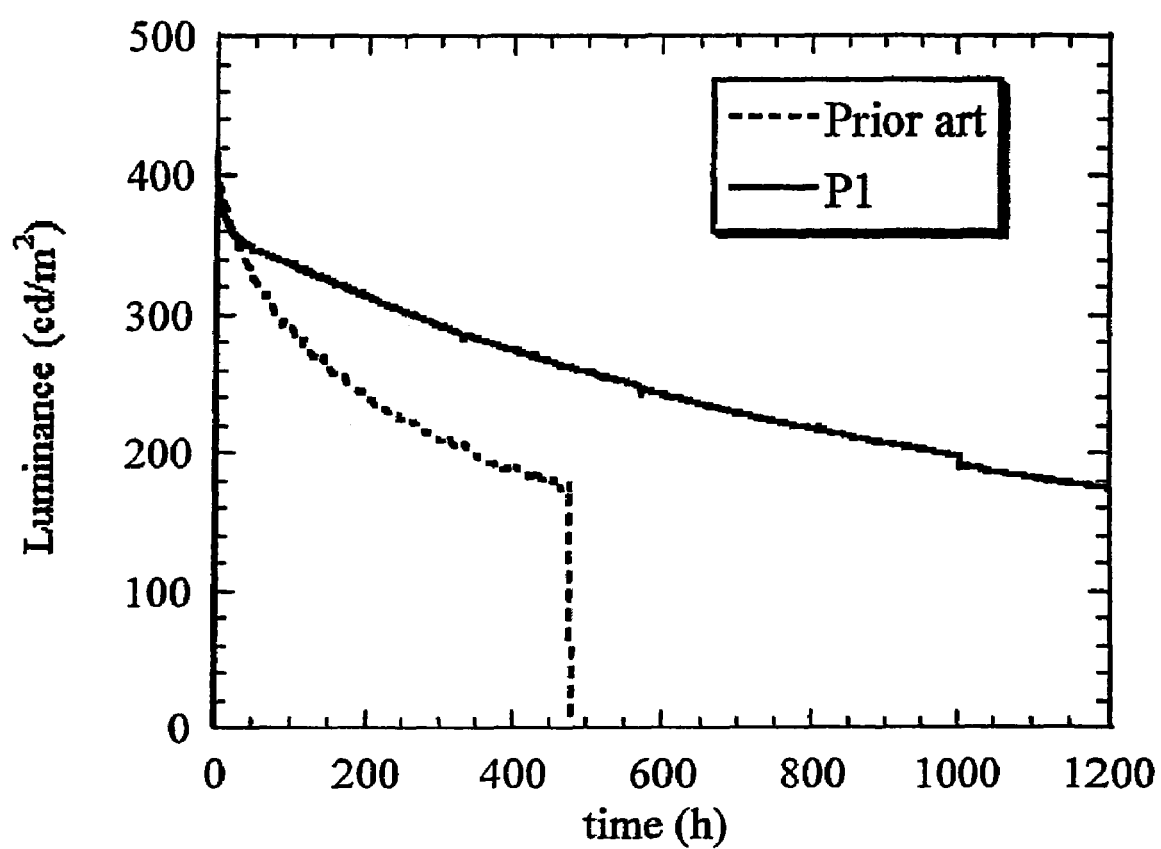
FIG. 2 shows a plot of luminance vs. time for a blue electroluminescent device according to the disclosure.

As can be seen from FIG. 2, removal of TFB from the polymer results in a significant improvement in lifetime.

Although the disclosure has been made in terms of specific exemplary embodiments, it will be appreciated that various modifications, alterations and/or combinations of features disclosed herein will be apparent to those skilled in the art without departing from the spirit and scope of the disclosure as set forth in the following claims.

The invention claimed is:

1. A polymer for use in an optical device comprising a first, optionally substituted, repeat unit of formula (I) and a second, optionally substituted, repeat unit of formula (II):

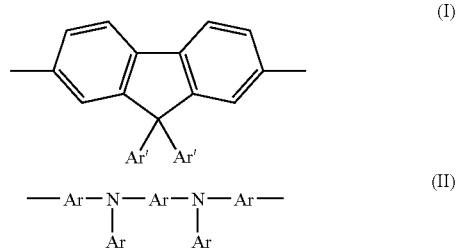

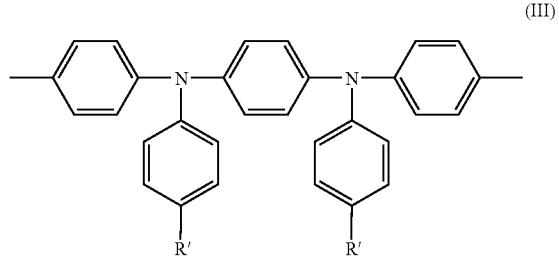

wherein each Ar and Ar' is the same or different and comprises an optionally substituted aryl or heteroaryl group, the polymer optionally further comprising a third, optionally substituted, repeat unit in a molar ratio of no greater than 5%, the third repeat unit having a formula —Ar—N(Ar)—Ar— and having a single nitrogen atom in its backbone, wherein the polymer comprises an electron transporting region including a chain of polyfluorene units comprising the repeat unit of formula (I).

2. A polymer according to claim 1 wherein the second repeat unit comprises a repeat unit of formula (III):

3. A polymer according to claim 2 wherein each R' is optionally substituted alkyl or alkoxy.

4. A polymer according to claim 3 wherein R is n-butyl.

5. A polymer according to claim 1 wherein the third repeat unit is absent.

6. A polymer according to claim 1 wherein each Ar is independently selected from the group consisting of optionally substituted residues of formula (IV):

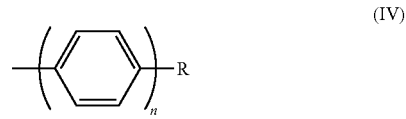

wherein n=1, 2 or 3 and R is a solubilizing group or hydrogen.

7. A polymer according to claim 6 wherein R is selected from the group consisting of optionally substituted alkyl and alkoxy groups.

8. A polymer according to claim 6 wherein R is hydrogen or butyl.

9. A polymer according to claim 1 comprising less than 50 mol % of repeat units of formula (I).

10. A polymer according to claim 9 comprising 10-40 mol % of repeat units of formula (I).

11. A polymer according to claim 1 comprising less than 30 mol % of repeat units of formula (II).

12. A polymer according to claim 1 comprising less than 10 mol % of repeat units of formula (II).

13. A polymer according to claim 1 comprising a further repeat unit selected from the group consisting of optionally substituted 9,9-dialkyl- and 9,9-dialkoxy-2,7-fluorenyl groups.

14. A polymer according to claim 13 wherein the further repeat unit is 9,9-di(n-octyl)fluorene.

15. A polymer according to claim 1 capable of emitting light in the wavelength range of 400 nm to 500 nm.

16. An optical device comprising a first electrode for injection of positive charge carriers, a second electrode for injection of negative charge carriers and a layer located between the first and second electrodes comprising a polymer as defined in claim 1.

17. An electroluminescent device comprising a first electrode for injection of positive charge carriers, a second electrode for injection of negative charge carriers and an electroluminescent region located between the first and second electrodes comprising a polymer as defined in claim 1.

18. An optical device according to claim 17 wherein said polymer is the only semiconducting polymer disposed in the electroluminescent region.

19. A polymer according to claim 1 capable of emitting light in the wavelength range of 430 nm to 500 nm.

20. A polymer according to claim 1, wherein a region is capable of both charge transport and emission.

21. An optical device according to claim 16, wherein the optical device includes at least one of a separate hole transporting layer or a separate electron transporting layer.

* * * * *

UNITED STATES PATENT AND TRADEMARK OFFICE
CERTIFICATE OF CORRECTION

PATENT NO. : 7,696,303 B2 Page 1 of 1
APPLICATION NO. : 10/514137
DATED : April 13, 2010
INVENTOR(S) : Richard O'Dell et al.

It is certified that error appears in the above-identified patent and that said Letters Patent is hereby corrected as shown below:

In the Specification:

At Column 5, line 53, "polymerisarion" should be -- polymerisation --.

Signed and Sealed this

Twelfth Day of October, 2010

David J. Kappos
*Director of the United States Patent and Trademark Office*